United States Patent
Ohashi et al.

(10) Patent No.: US 12,153,348 B2
(45) Date of Patent: Nov. 26, 2024

(54) METHOD FOR PRODUCING COATING FILM-FORMING COMPOSITION FOR LITHOGRAPHY

(71) Applicant: NISSAN CHEMICAL CORPORATION, Tokyo (JP)

(72) Inventors: Tomoya Ohashi, Toyama (JP); Toyoshiro Yoshida, Nagoya (JP); Suguru Sassa, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 699 days.

(21) Appl. No.: 17/296,408

(22) PCT Filed: Dec. 18, 2019

(86) PCT No.: PCT/JP2019/049504
§ 371 (c)(1),
(2) Date: May 24, 2021

(87) PCT Pub. No.: WO2020/130005
PCT Pub. Date: Jun. 25, 2020

(65) Prior Publication Data
US 2021/0397091 A1    Dec. 23, 2021

(30) Foreign Application Priority Data
Dec. 20, 2018 (JP) .................... 2018-238751

(51) Int. Cl.
G03F 7/11 (2006.01)
B01D 39/16 (2006.01)
B01J 20/26 (2006.01)
B01J 20/28 (2006.01)
C09D 181/04 (2006.01)

(52) U.S. Cl.
CPC .............. *G03F 7/11* (2013.01); *B01D 39/163* (2013.01); *B01J 20/265* (2013.01); *B01J 20/28035* (2013.01); *C09D 181/04* (2013.01); *B01D 2239/0407* (2013.01); *B01D 2239/0618* (2013.01); *B01D 2239/065* (2013.01); *B01D 2239/0695* (2013.01)

(58) Field of Classification Search
CPC .......... B01D 39/163; B01D 2239/0407; B01D 2239/0618; B01D 2239/065
See application file for complete search history.

(56) References Cited

U.S. PATENT DOCUMENTS

| 2007/0007196 A1* | 1/2007 | Komatsu ............... B01D 61/00 |
| | | 210/500.1 |
| 2011/0053091 A1 | 3/2011 | Hiroi et al. |
| 2013/0108958 A1 | 5/2013 | Ogihara et al. |
| 2017/0351179 A1 | 12/2017 | Goto et al. |
| 2017/0371244 A1 | 12/2017 | Hatakeyama et al. |
| 2018/0011404 A1 | 1/2018 | Hashimoto et al. |
| 2019/0163064 A1 | 5/2019 | Ohashi et al. |
| 2022/0096978 A1* | 3/2022 | Ohashi ................. C07C 41/36 |

FOREIGN PATENT DOCUMENTS

| CN | 101910948 A | 12/2010 |
| JP | 2009-90259 A | 4/2009 |
| JP | 2013-061426 A | 4/2013 |
| JP | 2013-092686 A | 5/2013 |
| JP | 2018-167223 A | 11/2018 |
| WO | 03/072221 A1 | 9/2003 |
| WO | 2004/099086 A1 | 11/2004 |
| WO | 2016/158863 A1 | 10/2016 |
| WO | 2017/191767 A1 | 11/2017 |
| WO | 2018/051716 A1 | 3/2018 |

OTHER PUBLICATIONS

Feb. 25, 2020 International Search Report issued in International Patent Application No. PCT/JP2019/049504.
Jun. 7, 2022 Office Action issued in Chinese Patent Application No. 201980082879.X.
Feb. 2, 2022 Office Action Issued in Finnish Patent Application No. 20215644.
May 25, 2023 Office Action Issued in Finnish Patent Application No. 20215644.

* cited by examiner

*Primary Examiner* — Vickey Nerangis
(74) *Attorney, Agent, or Firm* — Oliff PLC

(57) ABSTRACT

A method for producing a coating film-forming composition for lithography, including a step for passing a liquid through a filter cartridge. The filter cartridge is obtained by layering more than one type of filtration base fabrics or winding same around a hollow inner tube, wherein: the fabrics are nonwoven fabrics in which metal-adsorbing groups are chemically bonded to polyolefin fibers; the fabrics contain nonwoven fabric layers A and B; layer A is configured from polyolefin fibers to which sulfonic acid groups are chemically bonded as metal-adsorbing groups; and layer B is configured from polyolefin fibers to which at least one type selected from among amino groups, N-methyl-D-glucamine groups, iminodiacetic acid groups, iminodiethanol groups, amidoxime groups, phosphoric acid groups, carboxylic acid groups and ethylenediamine triacetic acid groups chemically bonded as metal-adsorbing groups. Thus, the amount of metal impurities that are the cause of minute defects on a wafer can be reduced.

5 Claims, No Drawings

METHOD FOR PRODUCING COATING FILM-FORMING COMPOSITION FOR LITHOGRAPHY

TECHNICAL FIELD

The present invention relates to a method for producing a coating film-forming composition for lithography having reduced metal impurities that cause a defect in the lithography process in the production of a semiconductor device.

BACKGROUND ART

Regarding the lithography process in the production of a semiconductor device, the composition used for forming a coating film for lithography (coating film-forming composition for lithography) in the lithography process is required to have reduced metal impurities that would cause very small defective portions (referred to as called a defect having a size of, for example about 1 to 100 nm) on a wafer. Patent Literature 1 discloses a filter having a high efficiency of adsorption and removal of metals.

CITATION LIST

Patent Literature

Patent Literature 1: JP 2018-167223 A

SUMMARY OF INVENTION

Technical Problem

An object of the present invention is to provide a method for producing a coating film-forming composition for lithography having reduced metal impurities that cause a defect on a wafer in the lithography process in the production of a semiconductor device, and a method for reducing metals in a precursor of a coating film-forming composition for lithography.

Solution to Problem

The present invention embraces the followings.

[1]
A method for producing a coating film-forming composition for lithography, comprising the step of passing a liquid through a metal removal filter cartridge,
wherein the metal removal filter cartridge is a filter cartridge having more than one type of filtration base fabric stacked on or a filter cartridge having more than one type of filtration base fabric wound round a hollow cylinder,
wherein the filtration base fabric is a nonwoven fabric of a polyolefin fiber having a metal-adsorbing group chemically bonded thereto,
wherein the filtration base fabric comprises a nonwoven fabric layer A and a nonwoven fabric layer B,
wherein the nonwoven fabric layer A comprises a polyolefin fiber having a sulfonic acid group chemically bonded as a metal-adsorbing group, and
wherein the nonwoven fabric layer B comprises a polyolefin fiber having at least one selected from the group consisting of an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group.

[2]
The method for producing a coating film-forming composition for lithography according to [1], further comprising the step of passing a liquid through a fine-particle removal filter cartridge.

[3]
The method for producing a coating film-forming composition for lithography according to [2], wherein a material for the fine-particle removal filter is at least one selected from the group consisting of polyethylene and nylon.

[4]
The method for producing a resist underlayer film-forming composition according to any one of [1] to [3], wherein the coating film-forming composition for lithography is a resist underlayer film-forming composition.

[5]
The method for producing a resist underlayer film-forming composition according to [4], wherein the coating film-forming composition for lithography comprises an organic solvent and a polymer having a weight average molecular weight of 800 or more.

[6]
The method for producing a resist underlayer film-forming composition according to [4] or [5], wherein the resist underlayer film-forming composition further comprises a crosslinkable compound.

[7]
The method for producing a resist underlayer film-forming composition according to any one of [4] to [6], wherein the resist underlayer film-forming composition further comprises a crosslinking catalyst.

[8]
The method for producing a resist underlayer film-forming composition according to any one of [4] to [7], wherein the resist underlayer film-forming composition further comprises a surfactant.

[9]
A method for reducing metals in a precursor of a coating film-forming composition for lithography, comprising passing a precursor of a coating film-forming composition for lithography through a metal removal cartridge filter to reduce metals in the precursor,
wherein the filter cartridge has more than one type of filtration base fabric stacked on or more than one type of filtration base fabric wound round a hollow cylinder,
wherein the filtration base fabric is a nonwoven fabric of a polyolefin fiber having a metal-adsorbing group chemically bonded thereto,
wherein the filtration base fabric comprises a nonwoven fabric layer A and a nonwoven fabric layer B,
wherein the nonwoven fabric layer A comprises a polyolefin fiber having a sulfonic acid group chemically bonded as a metal-adsorbing group, and
wherein the nonwoven fabric layer B comprises a polyolefin fiber having at least one member selected from an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group.

[10]
A method for producing a substrate having a resist pattern, comprising the steps of:

coating the resist underlayer film-forming composition according to any one of [4] to [8] onto a semiconductor substrate and baking the applied composition to form a resist underlayer film; and coating a resist film on the resist underlayer film, and then exposing and developing the resultant resist film to form a resist pattern, wherein the substrate is used in producing a semiconductor.

[11]

A method for producing a semiconductor device, comprising the steps of:

forming a resist underlayer film on a semiconductor substrate optionally having an inorganic film on a surface thereof using the resist underlayer film-forming composition according to any one of [4] to [8];

forming a resist pattern on the resist underlayer film;

dry etching the resist underlayer film using the resist pattern as a mask so as to expose a surface of the inorganic film or semiconductor substrate; and processing the inorganic film or semiconductor substrate by dry etching using the dry-etched resist and resist underlayer film as a mask.

[12]

A method for producing an organic solvent for a coating film-forming composition for lithography, comprising the step of passing a liquid through a metal removal filter cartridge, wherein the metal removal filter cartridge is a filter cartridge having more than one type of filtration base fabric stacked on or a filter cartridge having more than one type of filtration base fabric wound round a hollow cylinder, wherein the filtration base fabric is a nonwoven fabric having a metal-adsorbing group chemically bonded to a polyolefin fiber, wherein the filtration base fabric comprises a nonwoven fabric layer A and a nonwoven fabric layer B, wherein the nonwoven fabric layer A comprises a polyolefin fiber having a sulfonic acid group chemically bonded as a metal-adsorbing group, and wherein the nonwoven fabric layer B comprises a polyolefin fiber having at least one selected from the group consisting of an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group.

[13]

A method for producing a solvent for a coating film-forming composition for lithography, comprising the step of passing a liquid through a metal removal filter cartridge, wherein the metal removal filter cartridge is a filter cartridge having stacked more than one type of filtration base fabric or a filter cartridge having more than one type of filtration base fabric wound round a hollow cylinder, wherein the filtration base fabric is a nonwoven fabric having a metal-adsorbing group chemically bonded to a polyolefin fiber, wherein the filtration base fabric comprises a nonwoven fabric layer A and a nonwoven fabric layer B, wherein the nonwoven fabric layer A comprises a polyolefin fiber having a sulfonic acid group chemically bonded as a metal-adsorbing group, and wherein the nonwoven fabric layer B comprises a polyolefin fiber having at least one selected from an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group.

Advantageous Effects of Invention

Production of a coating film-forming composition for lithography using the filter cartridge described in the present invention, can produce a coating film-forming composition for lithography having markedly reduced metal impurities. It is possible to reduce various defects caused in the lithography process in the semiconductor production process.

DESCRIPTION OF EMBODIMENTS

<Method for Producing a Coating Film-Forming Composition for Lithography>

The method for producing a coating film-forming composition for lithography of the present invention comprises the step of preparing a precursor of a coating film-forming composition for lithography, which is in a solution state at room temperature, and then passing the prepared composition precursor through the metal removal filter cartridge described below in detail.

The step of passing the precursor is performed by, for example, producing a precursor of a coating film-forming composition for lithography by a known method, and then passing the precursor of the coating film-forming composition for lithography through a metal removal filter cartridge directly connected (at two portions, i.e., an inlet and an outlet) to the production apparatus for the composition (vessel for production). The step of passing the precursor may be performed once or twice or more times. Preferably, it is circulation filtration using a pump. Preferably, the precursor of the coating film-forming composition for lithography precursor is passed through both the metal removal filter cartridge according to the present invention and a fine-particle removal filter cartridge, which is provided upstream or downstream of the metal removal filter cartridge and connected in series to the metal removal filter cartridge, and circulated. The time required for the circulation is, for example, 3 to 144 hours, 6 to 72 hours, or 12 to 48 hours. The filtration flow rate is, for example, 1 to 1,000 L/hour, 10 to 500 L/hour, or 20 to 100 L/hour.

<Precursor of Coating Film-Forming Composition for Lithography>

The precursor of coating film-forming composition for lithography used in the present invention refers to any composition before being passed through the filter cartridge specified above, for example, the below-described photoresist composition, resist underlayer film-forming composition (containing an organic compound and/or an inorganic compound), protective film-forming composition for protecting a substrate from an etching liquid during processing of a semiconductor substrate, underlayer film-forming composition for a directed self-assembled film, upper-layer film-forming composition for a directed self-assembled film, or resist upper-layer film-forming composition; however, the precursor is not limited to these compositions.

Regarding the wavelength for exposure in the lithography process, an i-line, a KrF excimer laser, an ArF excimer laser, an EUV (extreme ultraviolet light), or an EB (electron beam) may be used.

In addition, the precursor may be the resist upper-layer film-forming composition for a resist upper-layer film described in, for example, WO2014/115843 and WO2015/129486; the underlayer film-forming composition for a directed self-assembled film utilizing a direct self assembly (DSA) technique of a block copolymer described in, for example, WO2013/146600 and WO2014/097993; the upper-layer film-forming composition for a directed self-assembled film described in, for example, WO2018/051907; or the covering composition for pattern inversion described in, for example, WO2016/031563.

Examples of the precursors include a photoresist composition (positive and negative) for a known photoresist film formed through application to a semiconductor wafer preferably by spin coating and the baking step; a resist underlayer film-forming composition (containing an organic compound and/or an inorganic compound) for a known resist underlayer film; a protective film-forming composition for a known semiconductor substrate protective film for use in wet etching a known semiconductor substrate; a resist upper-layer film-forming composition for a known resist upper-layer film; a underlayer film-forming composition for a known directed self-assembled film; and an upper-layer film-forming composition for a known directed self-assembled film; however, preferred is a protective film-forming composition or a resist underlayer film-forming composition. Preferred is a resist underlayer film-forming composition. Preferred is a resist underlayer film-forming composition for ArF, EUV, or EB. Preferred is a underlayer film-forming composition for a directed self-assembled film. Preferred is an upper-layer film-forming composition for a directed self-assembled film. Preferred is a resist upper-layer film-forming composition for EUV. Preferred is a covering composition for pattern inversion.

Examples of resist underlayer film-forming compositions include the protective film-forming composition, resist underlayer film-forming composition, and silicon-containing resist underlayer film-forming composition, which are described in, for example, WO2009/096340, JP 2009-053704 A, WO2010/147155, WO2011/102470, WO2013/047516, WO2015/030060, WO2018/052130, and Japanese Patent Application Nos. 2017-246142, 2017-246143, 2018-121282 and 2018-206860.

The solid content of the coating film-forming composition for lithography and a precursor of a coating film-forming composition for lithography precursor according to the present invention range usually from 0.1 to 70% by mass, preferably from 0.1 to 60% by mass, preferably from 0.1 to 40% by mass. The solid content refers to a proportion of total components left behind the removal of the solvent from the coating film-forming composition for lithography. The proportion of the polymer in the solid content is, for example, within the range of 1 to 100% by mass, 2 to 100% by mass, 3 to 100% by mass, 4 to 100% by mass, 5 to 100% by mass, 10 to 100% by mass, 30 to 100% by mass, 50 to 100% by mass, 6 to 100% by mass, 1 to 99.9% by mass, 50 to 99.9% by mass, 50 to 95% by mass, or 50 to 90% by mass.

<Polymer>

The coating film-forming composition for lithography used in the present invention preferably comprises an organic solvent and a polymer having a weight average molecular weight of 800 or more.

As an example of specific structure of the polymer, the polymer preferably has a unit structure represented by the following formula (1):

[Chemical Formula 1]

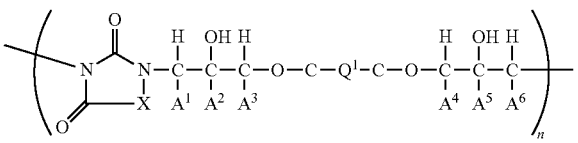

(1)

wherein X represents a group represented by the following formula (2), (3), or (4):

[Chemical Formula 2]

(2)

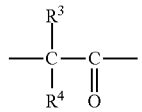

(3)

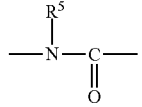

(4)

wherein each of $R^1$ to $R^5$ independently represents a hydrogen atom, an alkyl group having 1 to 6 carbon atoms, an alkenyl group having 2 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atoms, a nitro group, a cyano group, and an alkylthio group having 1 to 6 carbon atoms, and $R^1$ and $R^2$, and $R^3$ and $R^4$ are optionally bonded together to form a ring having 3 to 6 carbon atoms, each of $A^1$ to $A^6$ independently represents a hydrogen atom, a methyl group, or an ethyl group, $Q^1$ represents a divalent group containing a disulfide linkage, preferably represents a divalent group containing an alkylene group having 1 to 6 carbon atoms at each of the both ends of a disulfide linkage, and n indicates the number of repeating unit structures, and represents an integer of 5 to 100.

The polymer in the present invention includes, for example, the polymer described in WO 2009/096340, and the reaction product of a bi- or higher functional compound having at least one disulfide linkage and a tri- or higher functional compound described in Japanese Patent Application No. 2018-121282; however, the polymer is not limited to these examples.

When the polymer is a reaction product of a bifunctional compound (A) having at least one disulfide linkage and a bifunctional compound (B) different from compound (A), a disulfide linkage is present in the principal chain of the polymer.

The polymer may have a repeating unit structure represented by the following formula (1):

[Chemical Formula 3]

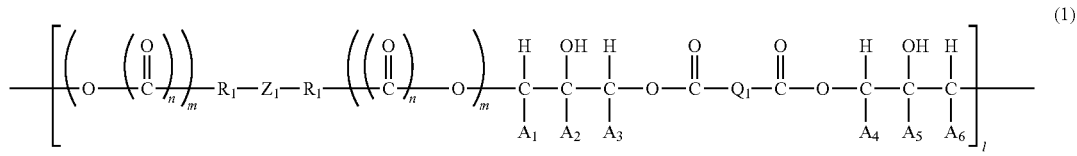
(1)

wherein $R_1$ represents an alkyl group having 0 to 1 carbon atom, n indicates the number of repeating unit structure, and represents an integer of 0 or 1, m represents an integer of 0 or 1, $Z_1$ represents a group represented by the following formula (2) or (3):

[Chemical Formula 4]

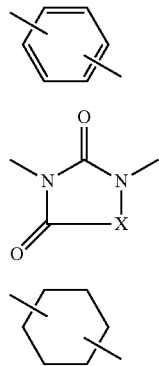

wherein, in formula (3) above, X is a group represented by the following formula (4), (51), or (6):

[Chemical Formula 5]

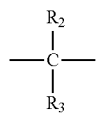
(4)

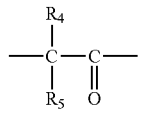
(51)

(6)

$$\begin{array}{c} R_{61} \\ | \\ -N-C- \\ \| \\ O \end{array}$$

wherein each of $R_2$ to $R_{61}$, or $R_2$, $R_3$, $R_4$, $R_5$ and $R_{61}$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atoms, a nitro group, a cyano group, and an alkylthio group having 1 to 6 carbon atoms, and $R_2$ and $R_3$, and $R_4$ and $R_5$ are optionally bonded together to form a ring having 3 to 6 carbon atoms, each of $A_1$ to $A_6$ independently represents a hydrogen atom, a methyl group, or an ethyl group, $Q_1$ represents an alkylene group having 1 to 10 carbon atoms and being interrupted by a disulfide linkage, and
l indicates the number of repeating unit structures, and represents an integer of 5 to 100.

$Q_1$ is preferably an alkylene group having 2 to 6 carbon atoms and being interrupted by a disulfide linkage.

Examples of the "rings having 3 to 6 carbon atoms" include cyclopropane, cyclobutane, cyclopentane, cyclopentadiene, and cyclohexane.

Formula (1) above may be represented by the following formula (5):

[Chemical Formula 6]

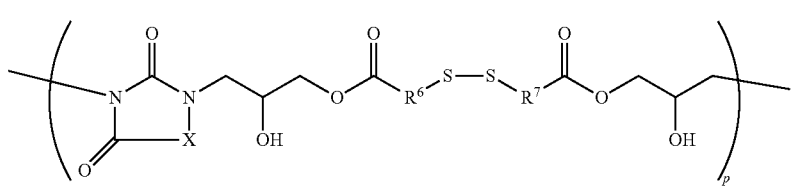
(5)

wherein X represents a group represented by the formula (4), (51), or (6) above, each of $R^6$ and $R^7$ independently represents an alkylene group having 1 to 3 carbon atoms or a direct bond, and
p represents an integer of 5 to 100, which indicates the number of repeating unit structures.

The polymer in the present invention is preferably represented by the following (Formula P-6) to (Formula P-8).

[Chemical Formula 7]

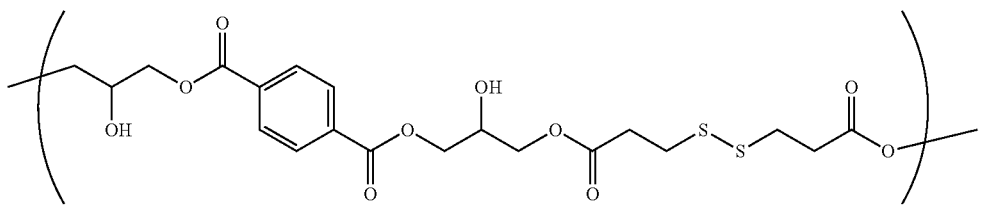

(Formula P-6)

[Chemical Formula 8]

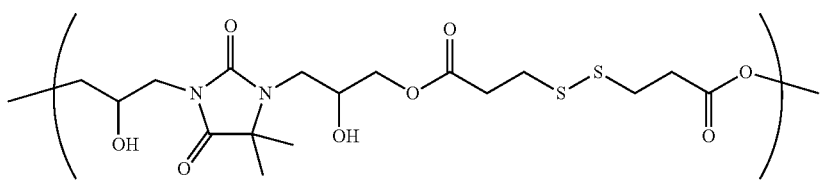

(Formula P-7)

[Chemical Formula 9]

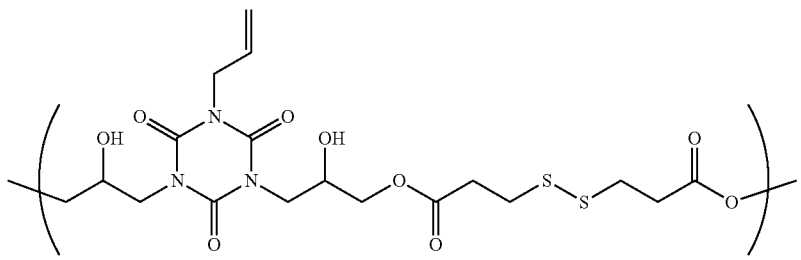

(Formula (P-8))

The polymer is preferably a reaction product synthesized according to a known method by reacting a bi- or higher functional compound (A) having at least one disulfide linkage and a bi- or higher functional compound (B).

Examples of the alkyl groups having 1 to 6 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the alkenyl groups having 2 to 6 carbon atoms include a vinyl group, an allyl group, a propenyl group, a butenyl group, a hexenyl group, and a cyclohexenyl group.

Examples of alkoxy groups having 1 to 6 carbon atoms include a methoxy group, an ethoxy group, a n-propoxy group, an isopropoxy group, a n-butoxy group, a t-butoxy group, a cyclopentyloxy group, and a cyclohexyloxy group.

Examples of the alkylthio groups having 1 to 10 carbon atoms include an ethylthio group, a butylthio group, a hexylthio group, and an octylthio group.

Examples of the alkylene groups having 1 to 6 carbon atoms include divalent organic groups corresponding to the above-mentioned alkyl groups, such as a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, and a 2-ethyl-3-methyl-cyclopropylene group.

The polymer having a weight average molecular weight of 800 or more, for example, 800 to 100,000, 1,500 to 50,000, 2,000 to 30,000, or 3,000 to 20,000 may be used.

The weight average molecular weight can be determined under, for example, the following conditions.

Apparatus: HLC-8320GPC, manufactured by Tosoh Corp.
GPC Column: Shodex [registered trademark]-Asahipak [registered trademark] (Showa Denko K.K.)
Column temperature: 40° C.
Flow rate: 0.35 mL/minute
Eluent: Tetrahydrofuran (THF)
Standard sample: Polystyrene (Tosoh Corp.)

<Organic Solvent>

The coating film-forming composition for lithography in the present invention may be produced by dissolving the above-mentioned components in an organic solvent, and may be used in a uniform solution state.

With respect to the organic solvent for the coating film-forming composition for lithography in the present invention, there is no particular limitation as long as it is a solvent that can dissolve therein the above-mentioned components, and any of such solvents may be used. Particularly, the coating film-forming composition for lithography and the precursor of the coating film-forming composition for lithography in the present invention are used in a uniform solution state, and, taking the coating properties of the composition into consideration, it is recommended that an organic solvent usually used in the lithography process is used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. The solvent may be used alone or in combination of two or more.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

<Crosslinkable Compound>

The coating film-forming composition for lithography used in the present invention preferably contains a crosslinkable compound. Examples of crosslinkable compounds include melamine compounds, substituted urea compounds, or the polymers thereof; epoxy compounds or the polymers thereof; and blocked isocyanate compounds or the polymers thereof. Preferred is a crosslinkable compound having at least two crosslinking forming substituents, and such a compound includes methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A specific example is tetramethoxymethylglycoluril. Further, a condensation product of the above compounds may be used.

As the crosslinkable compound, a crosslinking agent having a high heat resistance may be used. As the crosslinking agent having a high heat resistance, a compound containing in the molecule thereof a crosslinking forming substituent having an aromatic ring (for example, a benzene ring or a naphthalene ring) may be used.

Examples of the crosslinkable compounds include compounds having a partial structure of formula (5-1) below, and polymers or oligomers having repeating units of formula (5-2) below.

[Chemical Formula 10]

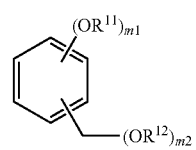

Formula (5-1)

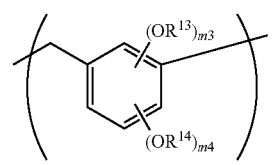

Formula (5-2)

The above-mentioned $R^{11}$, $R^{12}$, $R^{13}$, and $R^{14}$ are a hydrogen atom or an alkyl group having 1 to 10 carbon atoms, and, as the alkyl group, those mentioned above as examples may be used.

m1 satisfies the relationship: $1 \leq m1 \leq 6-m2$, m2 satisfies the relationship: $1 \leq m2 \leq 5$, m3 satisfies the relationship: $1 \leq m3 \leq 4-m2$, and m4 satisfies the relationship: $1 \leq m4 \leq 3$.

Examples of the compounds, polymers, and oligomers of formulae (5-1) and (5-2) are shown below.
[Chemical Formula 11]
Formula (6-1)
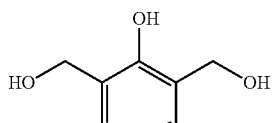
Formula (6-2)
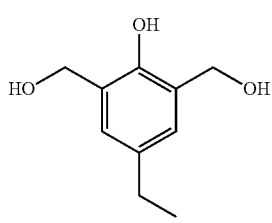
Formula (6-3)
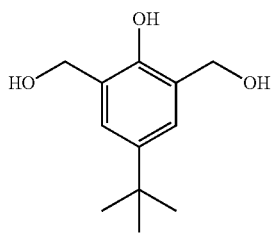
Formula (6-4)
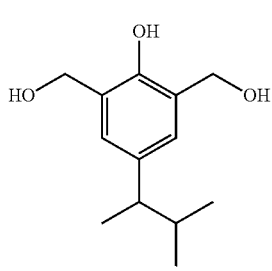
Formula (6-5)
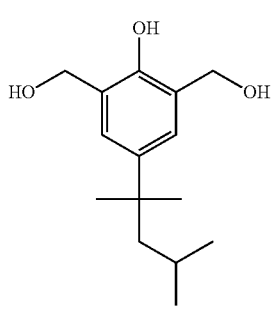
Formula (6-6)
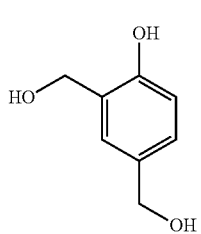
-continued
Formula (6-6)
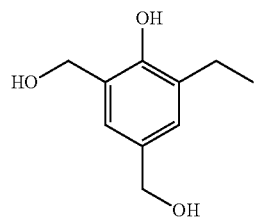
Formula (6-7)
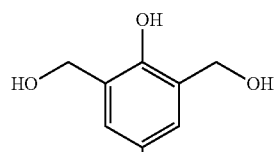
Formula (6-8)
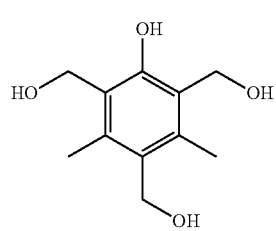
Formula (6-9)
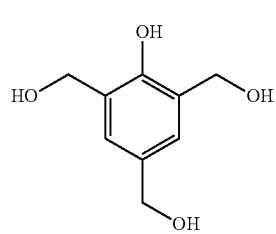
Formula (6-10)
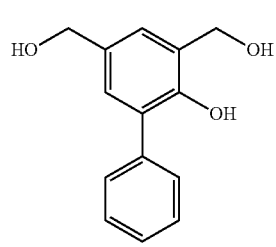
Formula (6-11)
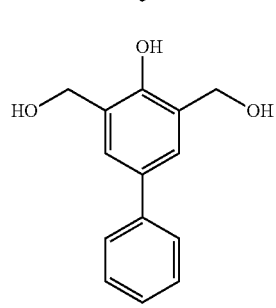
Formula (6-12)
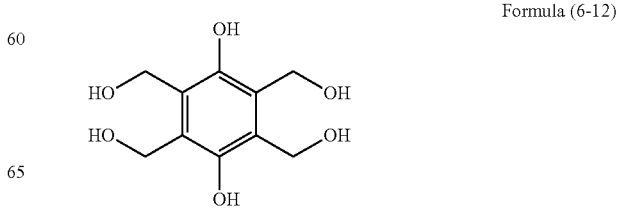

Formula (6-13)
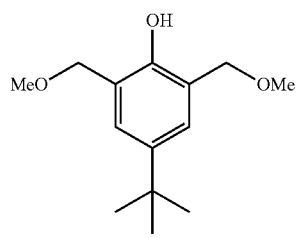

Formula (6-14)
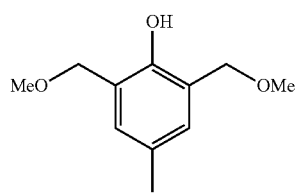

[Chemical Formula 12]

Formula (6-15)
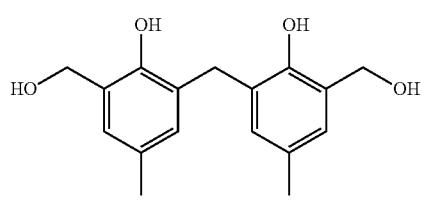

Formula (6-16)
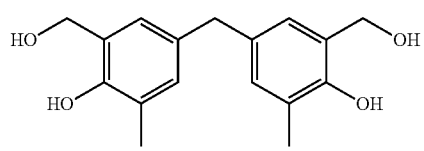

Formula (6-17)
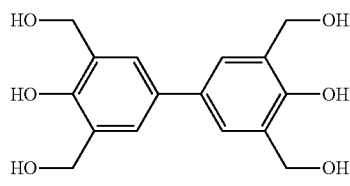

Formula (6-18)
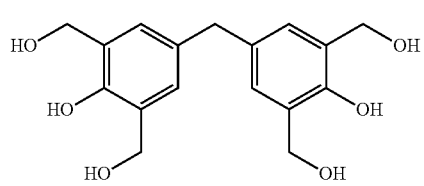

Formula (6-19)
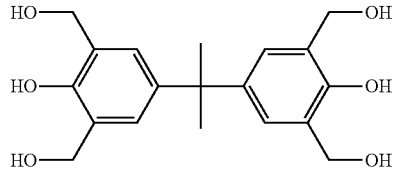

Formula (6-20)
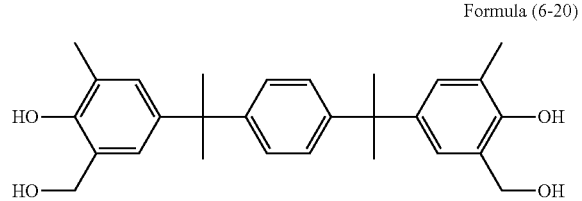
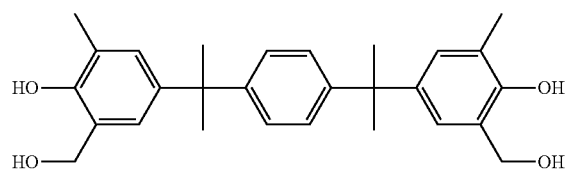

Formula (6-21)
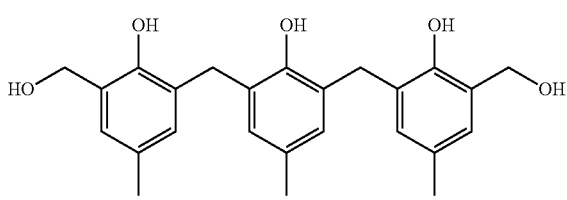

Formula (6-22)
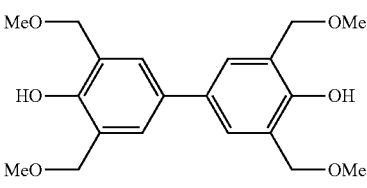

Formula (6-23)
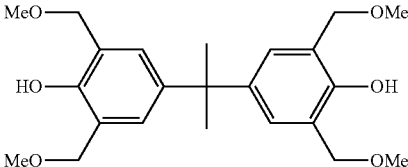

Formula (6-24)
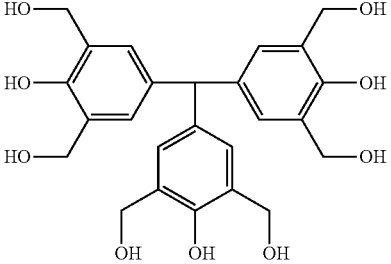

Formula (6-25)
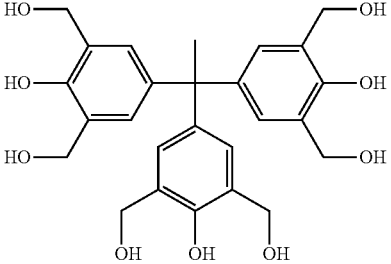

Formula (6-26)
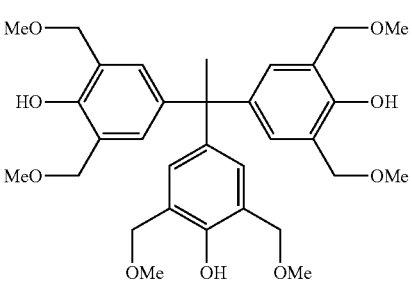

The above-mentioned compounds are available as products of Asahi Yukizai Corporation and Honshu Chemical Industry Co., Ltd. For example, among the above-mentioned crosslinking agents, the compound of formula (6-22) is available as trade name: TMOM-BP, manufactured by Asahi Yukizai Corporation.

As the crosslinking agent, a compound having at least two epoxy groups may also be used. Examples of such compounds include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, diglycidyl 1,2-cyclohexanedicarboxylate, 4,4'-methylenebis(N,N-diglycidylaniline), 3,4-epoxycyclohexylmethyl-3,4-epoxycyclohexanecarboxylate, trimethylolethane triglycidyl ether, bisphenol-A-diglycidyl ether; Epolead (registered trademark) GT-401, Epolead GT-403, Epolead GT-301, Epolead GT-302, Celloxide (registered trademark) 2021, Celloxide 3000, manufactured by Daicel Corporation; 1001, 1002, 1003, 1004, 1007, 1009, 1010, 828, 807, 152, 154, 180S75, 871, 872, manufactured by Mitsubishi Chemical Corporation; EPPN 201, EPPN 202, EOCN-102, EOCN-103S, EOCN-104S, EOCN-1020, EOCN-1025, EOCN-1027, manufactured by Nippon Kayaku Co., Ltd.; Denacol (registered trademark) EX-252, Denacol EX-611, Denacol EX-612, Denacol EX-614, Denacol EX-622, Denacol EX-411, Denacol EX-512, Denacol EX-522, Denacol EX-421, Denacol EX-313, Denacol EX-314, Denacol EX-321, manufactured by Nagase Chemtex Corporation; CY175, CY177, CY179, CY182, CY184, CY192, manufactured by BASF Japan Ltd.; and EPICLON 200, EPICLON 400, EPICLON 7015, EPICLON 835LV, EPICLON 850CRP, manufactured by DIC Corporation.

As the compound having at least two epoxy groups, a polymer having an epoxy group may be used. With respect to the above-mentioned polymer, there is no particular limitation as long as it is a polymer having an epoxy group, and any of such polymers may be used. Such a polymer may be produced by addition polymerization using an addition-polymerizable monomer having an epoxy group, or may be produced by a reaction of a polymer compound having a hydroxyl group and a compound having an epoxy group, such as epichlorohydrin or glycidyl tosylate. Examples of the polymers include addition polymerization polymers, such as polyglycidyl acrylate, a copolymer of glycidyl methacrylate and ethyl methacrylate, and a copolymer of glycidyl methacrylate, styrene, and 2-hydroxyethyl methacrylate, and polycondensation polymers, such as epoxy novolak. The polymer has a weight average molecular weight of, for example, 300 to 200,000. The weight average molecular weight is a value obtained by gel permeation chromatography (GPC) using polystyrene as a standard sample.

As the compound having at least two epoxy groups, an epoxy resin having an amino group may be used. Examples of such epoxy resins include YH-434, YH-434L (manufactured by NSCC Epoxy Manufacturing Co., Ltd.) (former Tohto Kasei Co., Ltd.).

As the crosslinking agent, a compound having at least two blocked isocyanate groups may be used. Examples of such compounds include TAKENATE (registered trademark) B-830, TAKENATE B-870N, manufactured by Mitsui Chemicals, Inc., and VESTANAT (registered trademark)-B1358/100, manufactured by Evonik Degussa. The crosslinking agent may be used alone or in combination of two or more.

The amount of the crosslinkable compound added varies depending on, for example, the application solvent used, the substrate used, the required solution viscosity, or the required film form; however, it is within the range of usually 0.001 to 80% by weight, preferably 0.01 to 50% by weight, further preferably 0.1 to 40% by weight, based on the weight of the total solid content of the coating film-forming composition for lithography or the precursor of the coating film-forming composition for lithography. The crosslinkable compound possibly causes a crosslinking reaction due to self-condensation; however, when a crosslinkable substituent is present in the above-mentioned polymer in the present invention, the crosslinkable compound and the crosslinkable substituent can together cause a crosslinking reaction.

<Crosslinking Catalyst>

The coating film-forming composition for lithography and the precursor of the coating film-forming composition for lithography according to the present invention may contain, as an optional component, a crosslinking catalyst for accelerating the crosslinking reaction. As the crosslinking catalyst, an acidic compound (crosslinking acid catalyst) as well as a compound capable of generating an acid or base due to heat may be used. As the acidic compound, a sulfonic acid compound or a carboxylic acid compound may be used, and, as the compound capable of generating an acid due to heat, a thermal acid generator may be used. Of these, a crosslinking acid catalyst is preferably used.

Examples of sulfonic acid compounds or carboxylic acid compounds include ammonium trifluoroacetate, p-toluenesulfonic acid, trifluoromethanesulfonic acid, pyridinium trifluoromethanesulfonate, pyridinium p-toluenesulfonate, pyridinium 4-hydroxybenzenesulfonate, salicylic acid, camphorsulfonic acid, 5-sulfosalicylic acid, 4-chlorobenzenesulfonic acid, 4-hydroxybenzenesulfonic acid, pyridinium 4-hydroxybenzenesulfonate, benzenedisulfonic acid, 1-naphthalenesulfonic acid, 4-nitrobenzenesulfonic acid, citric acid, benzoic acid, and hydroxybenzoic acid.

Examples of thermal acid generators include K-PURE [registered trademark] CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

The crosslinking catalyst may be used alone or in combination of two or more.

When the coating film-forming composition for lithography contains a crosslinking catalyst, the amount of the crosslinking catalyst contained is within the range of usually 0.0001 to 20% by weight, preferably 0.01 to 15% by weight, further preferably 0.1 to 10% by mass, based on the weight of the total solid content of the coating film-forming composition for lithography.

<Surfactant>

The coating film-forming composition for lithography used in the present invention may contain, as an optional component, a surfactant for improving the application properties to a semiconductor substrate. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP [registered trademark] EF301, EFTOP EF303, EFTOP EF352 (manufactured by Mitsubishi Materials Electronic Chemicals Co., Ltd.), MEGAFACE [registered trademark] F171, MEGAFACE F173, MEGAFACE R-30, MEGAFACE R-30N, MEGAFACE R-40, MEGAFACE R-40-LM (manufactured by DIC Corporation), Fluorad FC430, Fluorad FC431 (manufactured by Sumitomo 3M), and AsahiGuard [registered trademark] AG710, Surflon [registered trademark] S-382, Surflon SC101, Surflon SC102, Surflon SC103, Surflon SC104, Surflon SC105, Surflon SC106 (manufactured by AGC Inc.), and organosiloxane polymer KP341 (manufactured by Shin-Etsu Chemical Co., Ltd.). The surfactant may be used alone or in combination of two or more. When the coating film-forming composition for lithography contains a surfactant, the amount of the surfactant contained is within the range of usually 0.0001 to 10% by weight, preferably 0.01 to 5% by weight, based on the weight of the total solid content of the coating film-forming composition for lithography.

<Other Components>

In the coating film-forming composition for lithography in the present invention, for example, a light absorber, a rheology modifier, or a bonding auxiliary may be added. The rheology modifier is effective in improving the fluidity of the coating film-forming composition for lithography. The bonding auxiliary is effective in improving the adhesion between the resist underlayer film and a semiconductor substrate or resist.

<Filter Cartridge>

The filter cartridge used in the present invention is preferably one which is described in JP 2018-167223 A.

The filter cartridge used in the present invention is a filter cartridge having more than one type of filtration base fabric stacked on or a filter cartridge having more than one type of filtration base fabric wound round a hollow cylinder, wherein the filtration base fabric is a nonwoven fabric having a metal-adsorbing group chemically bonded to a polyolefin fiber, wherein the filtration base fabric comprises a nonwoven fabric layer A and a nonwoven fabric layer B, wherein the nonwoven fabric layer A comprises a polyolefin fiber having a sulfonic acid group chemically bonded as a metal-adsorbing group, and wherein the nonwoven fabric layer B comprises a polyolefin fiber having at least one selected from the group consisting of an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group.

The filter cartridge used in the present invention is a filter cartridge having more than one type of filtration base fabric stacked on or a filter cartridge having more than one type of filtration base fabric wound round a hollow cylinder, wherein the filtration base fabric is a nonwoven fabric having a metal-adsorbing group chemically bonded to a polyolefin fiber, and wherein the filtration base fabric comprises nonwoven fabric layer A and nonwoven fabric layer B. Nonwoven fabric layer A comprises a polyolefin fiber having a sulfonic group chemically bonded as a metal-adsorbing group, and nonwoven fabric layer B comprises a polyolefin fiber having at least one selected from the group consisting of an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group. Attributable to these features, metals can be efficiently removed. More than one type of filtration base fabric includes a single piece of filtration base fabric integrated by binding together different types of filtration base fabric.

In the present invention, nonwoven fabric layer B especially preferably comprises a polyolefin fiber having an iminodiethanol group chemically bonded thereto. This is because such a polyolefin fiber has a high efficiency of removal of metals. With respect to the metals that can be adsorbed, the sulfonic acid group adsorbs mainly Na, Cu, and K, and the iminodiethanol group adsorbs mainly Cr, Al, and Fe.

The polyolefin fiber constituting nonwoven fabric layers A and B is preferably a continuous fiber. This is because continuous fiber nonwoven fabric is unlikely to cause fabric tailings and has a high filter performance. Especially, preferred is melt-blown continuous fiber nonwoven fabric having a high weight per unit area (metsuke) of 10 to 100 g/m$^2$.

The polyolefin fiber constituting nonwoven fabric layers A and B preferably has a single fiber average diameter of 0.2 to 10 μm. When the single fiber average diameter of the polyolefin fiber is within the above range, a high filter performance can be achieved. In addition, the surface area (specific surface area) of the fiber may be increased, so that the surface of the base material for a graft polymerization reaction is increased, making it possible to increase the graft ratio.

With respect to the polyolefin fiber, preferred is one selected from polypropylene, a copolymer of propylene and ethylene, polyethylene, and a copolymer of ethylene and another α-olefin having 4 or more carbon atoms; and especially preferred is high density polyethylene. These polymers are inert and stable against a chemical liquid, and capable of undergoing graft polymerization.

It is preferred that the filter cartridge is a filter cartridge comprising a hollow cylinder and filtration base fabric, wherein the filtration base fabric is a nonwoven fabric having a metal-adsorbing group chemically bonded to a polyolefin fiber, and wherein the filtration base fabric is wound round the hollow cylinder to form a stacked structure.

The filter in the present invention is a filter having the above-mentioned filter cartridge incorporated. The filter cartridge has filtration base fabric wound round a cylinder and is contained in a container. When incorporating the filter cartridge into a container for filter, the filter cartridge in the state of being contained in the container is incorporated into the filter. In the case of a cartridge type filter, the filter function can be regenerated by replacing only the filter cartridge, but the present invention includes, for example, a capsule type filter such that the container for filter including the contents is replaced. In the case of a capsule type filter, a filtration portion corresponds to the filter cartridge.

The method for causing a functional group to be chemically bonded to a polyolefin fiber is described below. A polyolefin fiber is irradiated with an electron beam or radiation, such as a γ-ray, and then contacted with an emulsion containing a reactive monomer, such as GMA, or alternatively, a polyolefin fiber is contacted with an emulsion containing a reactive monomer and then irradiated with an electron beam or radiation, such as a γ-ray, thereby causing graft polymerization of the reactive monomer on the polyolefin fiber. When the polyolefin fiber is irradiated with an electron beam, the irradiation may be carried out so as to achieve an irradiation dose of usually 1 to 200 kGy, preferably 5 to 100 kGy, more preferably 10 to 50 kGy. With respect to the atmosphere conditions, the irradiation is preferably conducted in a nitrogen gas atmosphere. As an electron beam irradiation apparatus, one which is commercially available may be used, and, for example, as an area beam-type electron beam irradiation apparatus, EC250/15/

180L (manufactured by Iwasaki Electric Co., Ltd.), EC300/165/800 (manufactured by Iwasaki Electric Co., Ltd.), or EPS300 (manufactured by NHV Corporation) may be used.

A specific example of graft polymerization method includes a liquid-phase graft polymerization method, in which a nonwoven fabric is activated by irradiation with radiation, such as a γ-ray, or an electron beam; then the irradiated fabric is immersed in an emulsion containing water, a surfactant, and a reactive monomer, to complete the graft polymerization on the nonwoven fabric base material; and subsequently, a functional group, such as a sulfonic acid group, an amino group, an N-methyl-D-glucamine group, an iminodiacetic acid group, an iminodiethanol group, an amidoxime group, a phosphoric acid group, a carboxylic acid group, or an ethylenediaminetriacetic acid group, that is, an ion-exchange group and/or a chelate group is introduced into the graft chains formed on the base material. In the present invention, the graft polymerization method is not particularly limited to a liquid-phase graft polymerization method. A gas-phase graft polymerization method, in which a base material is contacted with vapor of a monomer to cause polymerization, or an impregnation gas-phase graft polymerization method, in which a base material is immersed in a monomer solution, and then removed from the monomer solution to cause a reaction in a gas phase, and the like may be used. Of the chemical formulae of representative functional groups, a sulfonic acid group (SC group) is shown in (Chemical Formula 13), an iminodiethanol group (IDE group) is shown in (Chemical Formula 14), an iminodiacetic acid group (IDA group) is shown in (Chemical Formula 15), and an N-methyl-D-glucamine group (NMDG group) is shown in (Chemical Formula 16).

[Chemical Formula 13]

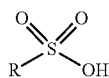

[Chemical Formula 14]

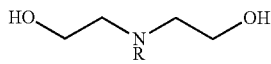

[Chemical Formula 15]

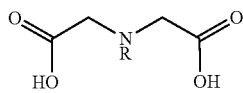

[Chemical Formula 16]

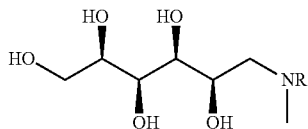

In the (Chemical Formula 13) to (Chemical Formula 16), R is polyethylene (PE)+GMA (Chemical Formula 17) or polypropylene (PP)+GMA (Chemical Formula 18).

[Chemical Formula 17]

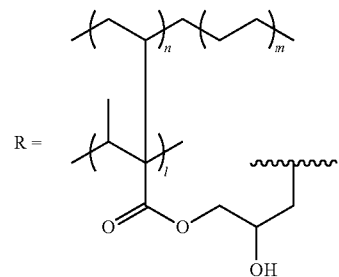

[Chemical Formula 18]

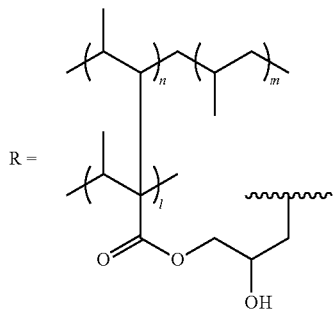

In the (Chemical Formula 17) and (Chemical Formula 18) above, n and m are an integer of 1 or more.

<Fine-Particle Removal Filter>

In the method for producing a coating film-forming composition for lithography of the present invention, it is preferred to pass the precursor of the coating film-forming composition for lithography through the filter cartridge, and then further pass it through a fine-particle removal filter. Any fine-particle removal filter known per se may be used. Preferably, the material for the fine-particle removal filter is at least one member selected from the group consisting of polyethylene and nylon.

The fine-particle removal filter usually has a pore diameter of 30 nm or less, preferably, 1 to 30 nm, 1 to 20 nm, or 1 to 10 nm, for example.

<Method for Reducing Metals>

The method of the present invention for reducing metals in a precursor of a coating film-forming composition for lithography is a method comprising filtering the precursor of the coating film-forming composition for lithography described above with a filter cartridge to reduce metals in the precursor, wherein the filter cartridge has more than one type of filtration base fabric stacked on or more than one type of filtration base fabric wound round a hollow cylinder, wherein the filtration base fabric is a nonwoven fabric having a metal-adsorbing group chemically bonded to a polyolefin fiber, wherein the filtration base fabric comprises a nonwoven fabric layer A and a nonwoven fabric layer B, wherein the nonwoven fabric layer A comprises a polyolefin fiber having a sulfonic acid group chemically bonded as a metal-adsorbing group, and wherein the nonwoven fabric layer B comprises a polyolefin fiber having at least one selected from an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group.

Attributable to the step, the precursor of the coating film-forming composition for lithography can be reduced in metal impurities contained therein, which are derived from the raw materials or solvents, making it possible to reduce defects in the lithography process.

By the above-mentioned method for reducing metals, various metal impurities (for example, Na, Cu, Cr, Al, and Fe) can be reduced to 0.5 ppb or less, 0.4 ppb or less, 0.3 ppb or less, 0.2 ppb or less, 0.1 ppb or less, for example.

The metal impurities can be quantitatively determined by, for example, the method described in the Examples.

<Method for Producing a Substrate Having a Resist Pattern, and Method for Producing a Semiconductor Device>

The method for producing a substrate having a resist pattern in the present invention and the method for producing a semiconductor device are described below.

The substrate having a resist pattern in the present invention may be produced by coating the above-described film-forming composition for lithography onto a semiconductor substrate and baking the coating film.

Examples of semiconductor substrates to which the coating film-forming composition for lithography in the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a BPSG (Boro-Phospho Silicate Glass) film, a titanium nitride film, a titanium nitride oxide film, a tungsten nitride film, a gallium nitride film, and a gallium arsenide film.

The resist underlayer film-forming composition in the present invention is coated onto the above-mentioned semiconductor substrate by an appropriate application method, such as a spinner or a coater. Then, the coating film is baked using a heating means, such as a hotplate, to form a resist underlayer film. Conditions for baking are usually appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes. The thickness of the formed lithography coating film is within the range of, for example, 0.001 to 10 µm, preferably 0.002 to 1 µm, more preferably 0.005 to 0.5 µm. A baking temperature lower than the above range could sometimes result in unsatisfactory crosslinking, thereby making it difficult to obtain a resistance of the formed resist underlayer film to a resist solvent or a basic aqueous hydrogen peroxide solution. To the contrary, a baking temperature higher than the above range could sometimes cause thermal decomposition of the resist underlayer film.

Exposure is carried out through a mask (reticle) for forming a predetermined pattern, using, for example, an i-line, a KrF excimer laser, an ArF excimer laser, an EUV (extreme ultraviolet light) or an EB (electron beam). In development, an alkaline developer is used, and the conditions of development are appropriately selected from those at a development temperature of 5 to 50° C. for a development time of 10 to 300 seconds. As an alkaline developer, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine may be used, for example. Further, an appropriate amount of an alcohol, such as isopropyl alcohol, or a surfactant, such as a nonionic surfactant may be added to the above-mentioned aqueous alkali solution before use. Of these, a preferred developer is a quaternary ammonium salt, and tetramethylammonium hydroxide and choline are more preferred. Further, a surfactant or the like may be added to the above developer. A method comprising developing a portion of the photoresist, in which the alkali dissolution rate is not improved, using an organic solvent, such as butyl acetate, in place of an alkaline developer may also be used.

Then, using the formed resist pattern as a mask, the lithography coating film is subjected to dry etching. The dry etching is carried out so as to expose the surface of the inorganic film in the case the above-mentioned inorganic film is formed on the surface of the semiconductor substrate used, and, so as to expose the surface of the semiconductor substrate in the case the inorganic film is not formed on the surface of the semiconductor substrate used. Thereafter, the step of processing the substrate by dry etching is performed, producing a semiconductor device.

EXAMPLES

Hereinbelow, the present invention is described in more detail with reference to the following Examples and others, which should not be construed as limiting the scope of the present invention.

Synthesis Example 1

800 g of monoallyldiglycidylisocyanuric acid (manufactured by Shikoku Chemicals Corporation), 608 g of 3,3'-dithiodipropionic acid (manufactured by Sakai Chemical Industry Co., Ltd.; trade name: DTDPA), and 53 g of triphenylmonoethylphosphonium bromide, a quaternary phosphonium salt, as a catalyst, were dissolved in 2,191 g of propylene glycol monomethyl ether. The resultant solution was heated and then stirred in a nitrogen gas atmosphere for 4 hours under controlling the temperature at 120° C. The obtained reaction product was diluted with 3,652 g of propylene glycol monomethyl ether, and the resultant solution was subjected to GPC analysis. As a result, a weight average molecular weight of the reaction product was about 7,800, by GPC using a conversion calibration curve obtained from the standard polystyrene. The reaction product contains a polymer compound having a structural unit represented by the following formula (A-1).

[Chemical Formula 19]

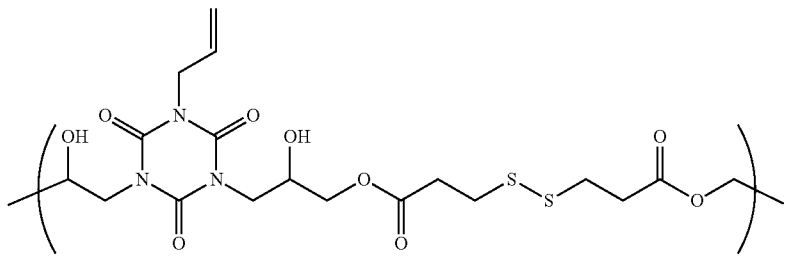

(A-1)

Preparation Example 1

To 3,575 g of a solution containing 715 g of the polymer compound obtained in Synthesis Example 1 above were added 179 g of tetramethoxymethylglycoluril [POWDER-LINK (registered trademark) 1174, manufactured by Nihon Cytec Industries Inc.], 18 g of 4-hydroxybenzenesulfonic acid (PSA), 11 g of bisphenol S, 7 g of a surfactant (R-30N, manufactured by DIC Corporation), 86.3 kg of propylene glycol monomethyl ether, and 9.9 kg of propylene glycol monomethyl ether acetate to prepare a composition for forming a resist underlayer film.

Example 1

90 kg of the resist underlayer film-forming composition obtained in Preparation Example 1 above was filtered through one cartridge filter (10 inches) (manufactured by Kurashiki Textile Manufacturing Co., Ltd.) described in JP 2018-167223 A, one polyethylene filter Microgard™ UC Filter (model number: CWCF01MSTUC; manufactured by Nihon Entegris G.K.), and one nylon filter Ultipleat P-Nylon (model number: ABD1ANM3EH1; manufactured by Nihon Pall Ltd.) at a filtration rate of 50 L/hour for 24 hours. A metal content of the solution obtained after the filtration was measured by means of an ICP-MS (Agilent 8800, manufactured by Agilent Technologies, Inc.).

Comparative Example 1

90 kg of the resist underlayer film-forming composition obtained in Preparation Example 1 above was filtered through one polyethylene filter Microgard™ UC Filter (model number: CWCF01MSTUC; manufactured by Nihon Entegris G.K.) and one nylon filter Ultipleat P-Nylon (model number: ABD1ANM3EH1; manufactured by Nihon Pall Ltd.) at a filtration rate of 50 L/hour for 24 hours. A metal content of the solution obtained after the filtration was measured by means of an ICP-MS (Agilent 8800, manufactured by Agilent Technologies, Inc.).

Comparative Example 2

To 90 kg of the resist underlayer film-forming composition obtained in Preparation Example 1 above was added 1.8 kg of a strongly acidic ion-exchange resin (XSC-1115-H, manufactured by Muromachi Chemicals Inc.). The resultant mixture was subjected to ion exchange in a batch for 4 hours. Thereafter, the ion-exchange resin was eliminated by filtration. The thus ion-exchanged, resist underlayer film-forming composition was filtered through one polyethylene filter Microgard™ UC Filter (model number: CWCF01MSTUC; manufactured by Nihon Entegris G.K.) and one nylon filter Ultipleat P-Nylon (model number: ABD1ANM3EH1; manufactured by Nihon Pall Ltd.) at a filtration rate of 50 L/hour for 24 hours. A metal content of the solution obtained after the filtration was measured by means of an ICP-MS (Agilent 8800, manufactured by Agilent Technologies, Inc.).

<Metal Concentration in Organic Solvent>

Table 1 shows the results of metal concentration after conducting the treatment methods in Example 1 and Comparative Examples 1 and 2.

TABLE 1

| Results of metal concentration measurement | |
| --- | --- |
| | Metal content |
| Example 1 | 0.4 ppb |
| Comparative Example 1 | 1.5 ppb |
| Comparative Example 2 | 0.7 ppb |

Table 1 shows that Example 1 can effectively reduce metals, as compared to the reduction of metals by nylon filter filtration and the reduction of metals by ion exchange.

INDUSTRIAL APPLICABILITY

According to the present invention, there is provided a coating film-forming composition for lithography reduced metal impurities remarkably.

The invention claimed is:

1. A method for producing a resist underlayer film-forming composition for lithography, the method comprising repeating a series of passing a precursor of the resist underlayer film-forming composition for lithography through a metal removal filter cartridge and subsequently passing the precursor through a fine-particle removal filter cartridge at a flow rate of 10 to 1,000 L/hour for 6 to 144 hours, to reduce metals in the precursor to 0.5 ppb or less,
   wherein the metal removal filter cartridge is a filter cartridge having stacked more than one type of filtration base fabric or a filter cartridge having more than one type of filtration base fabric wound round a hollow cylinder,
   wherein the filtration base fabric is a nonwoven fabric of a polyolefin fiber having a metal-adsorbing group chemically bonded thereto,
   wherein the filtration base fabric comprises a nonwoven fabric layer A and a nonwoven fabric layer B,
   wherein the nonwoven fabric layer A comprises a polyolefin fiber having a sulfonic acid group chemically bonded as a metal-adsorbing group, wherein the nonwoven fabric layer B comprises a polyolefin fiber having at least one selected from the group consisting of an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group, wherein the resist underlayer film-forming composition comprises an organic solvent and a polymer having a weight average molecular weight of 800 or more, and wherein a material for the fine-particle removal filter cartridge is at least one selected from the group consisting of polyethylene and nylon.

2. The method according to claim 1, wherein the resist underlayer film-forming composition further comprises a crosslinkable compound.

3. The method according to claim 1, wherein the resist underlayer film-forming composition further comprises a crosslinking catalyst.

4. The method according to claim 1, wherein the resist underlayer film-forming composition further comprises a surfactant.

5. A method for reducing metals in a precursor of a resist underlayer film-forming composition for lithography, the method comprising repeating a series of passing a precursor of the resist underlayer film-forming composition for lithography through a metal removal filter cartridge and subsequently passing the precursor through a fine-particle removal filter cartridge at a flow rate of 10 to 1,000 L/hour for 6 to 144 hours, to reduce metals in the precursor to 0.5 ppb or less, wherein the metal removal filter cartridge has more than one type of filtration base fabric stacked on or more than one type of filtration base fabric wound round a hollow cylinder, wherein the filtration base fabric is a nonwoven fabric of a polyolefin fiber having a metal-adsorbing group chemically bonded thereto, wherein the filtration base fabric comprises a nonwoven fabric layer A and a nonwoven fabric layer B, wherein the nonwoven fabric layer A comprises a polyolefin fiber having a sulfonic acid group chemically bonded as a metal-adsorbing group, wherein the nonwoven fabric layer B comprises a polyolefin fiber having at least one selected from the group consisting of an amino group, an N-methyl-D-glucamine group, an iminodiacetic acid group, an iminodiethanol group, an amidoxime group, a phosphoric acid group, a carboxylic acid group, and an ethylenediaminetriacetic acid group chemically bonded as a metal-adsorbing group, wherein the resist underlayer film-forming composition comprises an organic solvent and a polymer having a weight average molecular weight of 800 or more, and wherein a material for the fine-particle removal filter cartridge is at least one selected from the group consisting of polyethylene and nylon.

* * * * *